US012603039B2

(12) United States Patent
Toraille et al.

(10) Patent No.: US 12,603,039 B2
(45) Date of Patent: Apr. 14, 2026

(54) ELECTRONIC DISPLAY DEVICE OFFERING A DAY DISPLAY FUNCTION, AND A DISPLAY FUNCTION COMPATIBLE WITH NIGHT-VISION INSTRUMENTS

(71) Applicant: THALES, Meudon (FR)

(72) Inventors: Vincent Toraille, Merignac (FR); Thierry Kretz, Merignac (FR)

(73) Assignee: THALES, Meudon (FR)

( * ) Notice: Subject to any disclaimer, the term of this patent is extended or adjusted under 35 U.S.C. 154(b) by 0 days.

(21) Appl. No.: 18/783,481

(22) Filed: Jul. 25, 2024

(65) Prior Publication Data

US 2025/0037647 A1     Jan. 30, 2025

(30) Foreign Application Priority Data

Jul. 28, 2023     (FR) ...................................... 2308192

(51) Int. Cl.
| | |
|---|---|
| *G09G 3/32* | (2016.01) |
| *H01L 25/075* | (2006.01) |
| *H04N 5/33* | (2023.01) |
| *H10H 20/851* | (2025.01) |

(52) U.S. Cl.
CPC ........... *G09G 3/32* (2013.01); *H01L 25/0753* (2013.01); *H04N 5/33* (2013.01); *G09G 2320/0242* (2013.01); *G09G 2320/0666* (2013.01); *H10H 20/8512* (2025.01)

(58) Field of Classification Search
CPC ............. G09G 3/32; G09G 2320/0242; G09G 2320/0666; G09G 3/3208; G09G 3/3413;
G09G 3/3426; G09G 2300/0452; G09G 2380/12; H01L 25/0753; H04N 5/33; H10H 20/8512; H10K 59/10
See application file for complete search history.

(56) References Cited

U.S. PATENT DOCUMENTS

| | | | | |
|---|---|---|---|---|
| 6,570,584 | B1 | 5/2003 | Cok et al. | |
| 2007/0171623 | A1* | 7/2007 | Zagar | ................ G02F 1/133603 362/471 |
| 2014/0036533 | A1* | 2/2014 | Smith-Gillespie | .......................... G02F 1/133615 362/609 |
| 2014/0265928 | A1* | 9/2014 | Wagner | ................ G09G 3/3413 315/297 |

(Continued)

FOREIGN PATENT DOCUMENTS

CN          107 045 854 A      8/2017

*Primary Examiner* — Antonio Xavier

(74) *Attorney, Agent, or Firm* — BakerHostetler

(57) ABSTRACT

A display device including elementary components for composing an image. Each component is made up of a compact assembly of light-emitting diodes, one group of diodes comprising a red diode and one or more other diodes which together have an emission spectrum comprising, during nominal operation, less red than that of the red diode, the group carrying out with the other elementary components a colour display for an operator to the naked eye. The assembly further comprises an additional diode which has, during nominal operation, with respect to the red diode, a wavelength that is less close to red, and with respect to the common spectrum a supplementary emission spectrum, for a colour display compatible with the use by an operator and in the vicinity of the display device of a night-vision tool sensitive to the near-infrared.

12 Claims, 5 Drawing Sheets

(56) References Cited

U.S. PATENT DOCUMENTS

| | | | |
|---|---|---|---|
| 2015/0062196 A1 | 3/2015 | Tripathi | |
| 2017/0372646 A1* | 12/2017 | Cope | G09F 9/302 |
| 2019/0393069 A1* | 12/2019 | Paranjpe | B32B 7/12 |
| 2020/0241304 A1* | 7/2020 | Popovich | G02B 27/0176 |
| 2021/0097943 A1* | 4/2021 | Wyatt | H10K 59/353 |
| 2021/0350741 A1* | 11/2021 | Collot | G09G 3/3283 |
| 2022/0310000 A1* | 9/2022 | David | G09G 3/3225 |
| 2023/0217561 A1* | 7/2023 | Kim | G09G 3/3406 |
| | | | 315/291 |
| 2024/0188333 A1* | 6/2024 | Sakamoto | H10K 59/131 |
| 2024/0258361 A1* | 8/2024 | Wang | H10H 20/84 |
| 2024/0324429 A1* | 9/2024 | Du | G09F 9/30 |
| 2025/0012958 A1* | 1/2025 | Johnson | G02B 5/0278 |

* cited by examiner

5

ELECTRONIC DISPLAY DEVICE OFFERING A DAY DISPLAY FUNCTION, AND A DISPLAY FUNCTION COMPATIBLE WITH NIGHT-VISION INSTRUMENTS

CROSS-REFERENCE TO RELATED APPLICATION

This application claims priority to foreign French patent application No. FR 2308192, filed on Jul. 28, 2023, the disclosure of which is incorporated by reference in its entirety.

FIELD OF THE INVENTION

The invention relates to the field of colour display screens, in particular for aeronautics.

BACKGROUND

Of particular interest are screens for the control station of a civil or military aircraft—aeroplane or helicopter—of 3', 10' or 15' diagonals, for example, these dimension values constituting simple examples. These screens are used for navigation, mapping, visualization of the artificial horizon, or taxiing, in particular, but other applications exist and are conceivable.

These screens are often designed with LCD (liquid crystal display) technology. Liquid crystal displays use the properties of variable birefringence of crystals, the orientation of which can be varied as a function of an electric field. Backlighting is maintained permanently, recently by white LEDs (light-emitting diodes) (but historically, CCFLs (Cold Cathode Fluorescent Lamps) were used and are still commonly used today), and depending on the orientation of the liquid crystals, light is intermittently transmitted or not transmitted, since the liquid crystal is placed between two crossed polarizers. These are therefore thin-film transistors (TFTs) making it possible to control the voltage of the liquid crystals which define the pixels. In order to obtain colouration, three or four liquid crystal cells per pixel are used, and each provided, along with the liquid crystal, with a red, green or blue, or even white, colour filter which makes it possible, by turning on one or more of them, to obtain the desired colour. The backlighting LEDs, which may be 2 to 3 mm in width, may be naturally placed in an array, but also be put on the side (in a configuration called "edge-lit"), with a planar waveguide for example made of PMMA (polymethyl methacrylate acrylic or plexiglass), loaded in its volume to diffuse on the plane, or provided on the surface with screen printing of diffusing points for example. The edge-lit is a strip made up of a row of LEDs which are fixed to the circumference of the panel (in its rectangular frame), emitting horizontally in the diffusing light guide.

In addition, in aeronautics, and in particular in some particular applications such as maritime patrol activity, or mountain rescue, or else military aeroplanes, the pilots or other professional personnel required to stay in the cockpit use night-vision goggles or headsets, commonly called NVIS for Night Vision Imaging Systems, which react to the near-infrared range (wavelengths from 0.78 to 2.5 μm). These near-infrared waves are reflected by surfaces, even cold bodies. These instruments rely on amplifiers or intensifiers of residual light. They use the near-infrared waves present in the environment, for example by the mere fact of the presence of the moon in the sky.

It is thus necessary for the displays and lights of the cockpit of the aircraft which are used with night-vision equipment to be elements that are non-emissive or not very emissive for the near-infrared and by extension for the most pronounced red beyond 640 or 650 nm. For simple button lights, this is done using interference filters or green filters which do not allow the wavelengths thus evoked to pass. For these simple elements present in cockpits in large numbers for a long time, the environment of the professional is thus protected, so as not to impair the professional's field of vision when they wear night-vision equipment.

However, the same problem is of course present in the case of LCD display screens, which are present more and more and becoming larger in size. It is known to have a display system with two stages: a day function ensured by an array of LEDs in the background, which generates all the visible wavelengths, including the pronounced red, and a night function ensured by an edge-lit equipped with filters to avoid the emission of red and infrared wavelengths. Thus, light which reaches the liquid crystals and the colour filters along with them does not contain the wavelengths of the most pronounced red.

In some constructions, the edge-lit contains LEDs without a filter which provide a white light, therefore comprising red, and LEDs equipped with a filter which provide a light suitable for the task with the night-vision goggles or headsets, without the red end of the visible spectrum. One or the other of the two edge-lit systems is therefore turned on as required.

Irrespective of these considerations, LCD liquid crystal display technologies, based on the transmission and occultation of a light that is permanently present in the background, are supplemented by or in competition with technologies where coloured light is emitted by a quantum dot, namely a small physico-chemical structure capable of emission or fluorescence in a narrow spectral range. Such a quantum dot may be used in a liquid crystal display, and it is also in LED-based technologies for screens for the general public.

Thus, for example, OLED screens, without liquid crystals and without permanent backlighting, are successful—this is well known—in the general public domain, for example in smartphones—the pixels may be 150 μm for example. OLEDs or organic LEDs the size of which is of the order of magnitude of the pixel are formed by superposing a plurality of organic semiconductor layers and may be placed in a group of 4: one white, one red, one green and one blue, and it is possible to turn all of them off at the same time to have a deep black. The colour may be obtained in recent models by virtue of a quantum dot, even if less sophisticated colour filters, which offer less precision in the selection of wavelength, are also used. Importantly, the lifetime of these products seems insufficient for aeronautic applications. Their luminance potential likewise seems insufficient for these applications too.

By contrast, micro-LEDs are objects which have emerged recently and which are smaller (up to as little as 50 μm in width), using in particular indium gallium nitride InGaN and gallium nitride GaN semiconductors, and offering interesting perspectives for the aeronautics field, with increased expected lifetimes, shorter response times, of the order of a few nanoseconds, and low consumption. Micro-LEDs are for example controlled by CMOS circuits providing digital control.

Micro-LEDs may be placed in a group of three micro-LEDs each having one of three colours Red (approx. 630 nm) Green (approx. 570 nm) and Blue (approx. 450 nm) or RGB in the visible spectrum, in the vicinity of one another in a horizontal arrangement; vertical arrangements exist too.

Since they are turned on separately from one another, it is also possible to turn them off simultaneously, and this then offers a deep black, and in the end, the contrast is good.

Micro-LEDs which are natively different colours are envisaged but at present, the light output is not sufficient. It is also possible to use natively blue, more energy efficient micro-LEDs with, for two micro-LEDs out of three, a quantum dot to generate from blue, either green or red depending on the size of the quantum dot, in both cases with a likewise fairly small ray width, at mid-peak from 20 to 30 nm. Instead of quantum dots, a deposit of phosphor may be used.

Micro-LEDs do not heat up very much, have a high level of luminance and have a short response time. Their lifetime is likewise advantageous. Manufacturing methods are still in the course of development (depositing materials on glass or silicon wafers, with dimensions of less than 50 μm), which makes these products expensive in the short term.

However, at present, a compatible NVIS system with micro-LEDs has not been proposed.

SUMMARY OF THE INVENTION

In order to provide more efficient operation, the invention proposes an electronic display device comprising a display surface, and on the display surface, an arrangement on said surface of a plurality of elementary components for composing an image, the device further comprising a circuit for controlling the plurality of elementary components and that is configured to control each of the elementary components of the plurality individually, each elementary component being made up of a compact assembly of light-emitting diodes of different colours, one group of light-emitting diodes of the compact assembly comprising a so-called red diode which is the closest in the group, by its emission spectrum, to the red end of the visible light spectrum and one or more other light-emitting diodes which together have a common emission spectrum comprising, during nominal operation, proportionally less red than that of the red light-emitting diode, said group being controlled to carry out with the other elementary components a colour display for an operator to the naked eye.

The device is notable because the compact assembly further comprises an additional light-emitting diode in addition to those of said group, which additional light-emitting diode has, during nominal operation, with respect to said red diode, a wavelength that is shifted less close to red, and with respect to said common emission spectrum a supplementary emission spectrum, said additional light-emitting diode being controlled to be turned on as a replacement for said red diode which is then turned off when said group is controlled to carry out with the other elementary components a colour display compatible with the use by an operator and in the vicinity of the display device of a night-vision tool sensitive to the near-infrared.

Optionally and advantageously:
the group may comprise a red diode, a green diode and a blue diode;
the wavelength shifted less close to red may be shifted 5 to 50 nm with respect to said diode closest to the red end of the visible spectrum;
the wavelength shifted less close to red may be less than 640 nm;
the light-emitting diodes may be inorganic semiconductor microscopic LEDs or micro-LEDs;

the light-emitting diodes may be organic LEDs or OLEDs;
the compact assembly may be a group of four light-emitting diodes, each of the light-emitting diodes being rectangular and of identical length and width to the others, and said light-emitting diodes are arranged in a checkered pattern, length to length and width to width; the diodes may be in the form of a diamond, or hexagonal;
the light-emitting diodes may be blue light-emitting diodes, some of which are covered with a quantum dot to provide a different colour;
the light-emitting diodes may be blue light-emitting diodes, some of which are covered with phosphor to provide a different colour;
the light-emitting diodes may be light-emitting diodes which are natively of distinct colours;
the light-emitting diodes may comprise electronically excited quantum dots;
the device may comprise a low-current control circuit for the light-emitting diode having a wavelength shifted less close to red, and for the light-emitting diodes used in combination with the light-emitting diode having a wavelength shifted less close to red to form combinations of colours;
the arrangement of the diodes may constitute a tessellation of the surface.

BRIEF DESCRIPTION OF THE DRAWINGS

The invention will be better understood and other advantages will become apparent on reading the following non-limiting description with reference to the appended figures, in which.

DETAILED DESCRIPTION

The pixel is a basic set of coloured light-emitting diodes which, grouped together, form the image element.

Figure 1A:
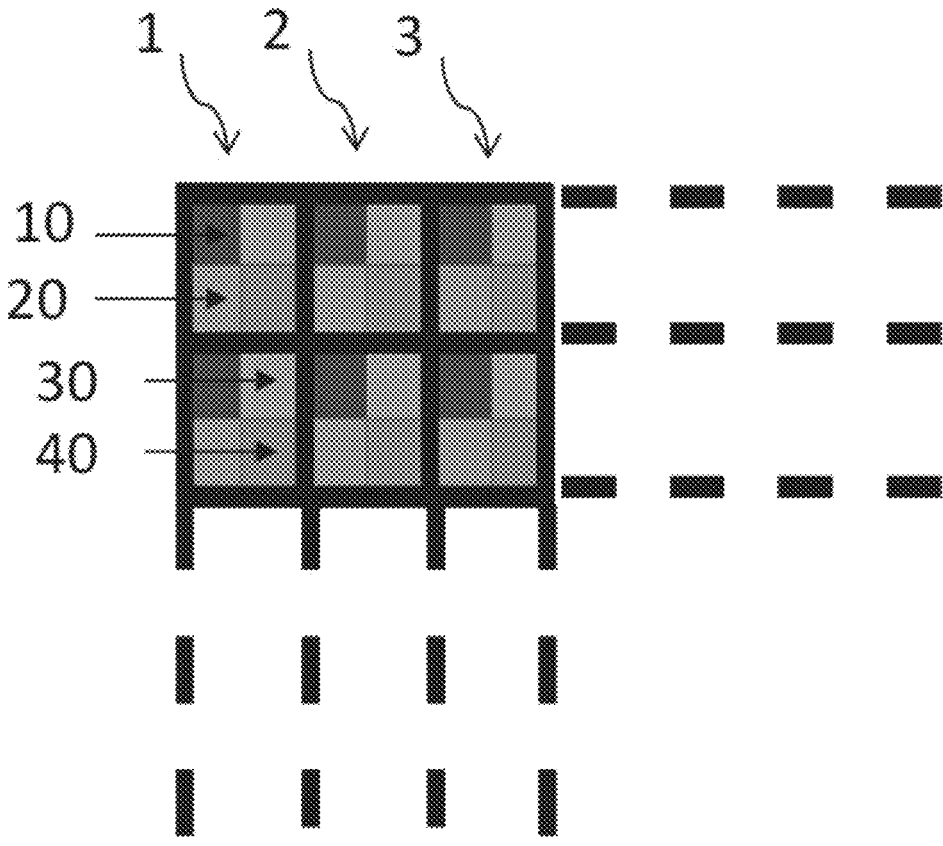
FIGS. 1A, 1B, 1C and 1D are schematic representations of examples of a display device according to the invention.

FIG. 1A is a view of an arrangement of micro-LEDs according to the invention.

Rectangular pixels 1, 2, 3 . . . are arranged in a checkered pattern, widths to widths, lengths to lengths. These pixels may be square. The arrangement in a checkered pattern makes it possible to realize a complete tessellation of the plane of the display device, with no space uncovered by the pixels. Of course, between two pixels, there is a thin, non-luminous, separation structural strip which allows, depending on the designs, mechanical support, electrical connection, electrical or thermal insulation. The separation strip may be reduced to the strict minimum up to being invisible. Each of the pixels 1, 2, 3 . . . is in itself composed of four square micro-LEDs of four constant colours from one pixel to the other and arranged in a 2×2 checkered pattern with, preferably, without this being absolutely essential, the same relative arrangement in each pixel. The four colours are red, green, blue and orange, and there is thus in each pixel, a red micro-LED 10, a blue micro-LED 20, a green micro-LED 30 and an orange (or "NVIS red") micro-LED 40, the red and orange micro-LEDs being diagonal to one another, although alternatively, it is envisaged that they touch at the side.

The orange micro-LED 40 is used as a replacement for the red micro-LED 10 in the situation of night vision with NVIS equipment. Conversely, the red micro-LED 10 is used in the situation of day vision, and in general in all situations of vision without night-vision equipment. The micro-LEDs 20 and 30 are used in all circumstances.

Alternatively, instead of having a square checkered tessellation of the plane, a tessellation to form hexagonal pixels, or diamond pixels, is put in place.

For the orange micro-LED 40, a population of quantum dots with an emission wavelength (depending directly on the size of the nanoparticles) for example situated between 600 and 620 nm is chosen.

For the red, green and blue pixels, use is made of quantum dots in accordance with usual wavelengths, making it possible to cover the NTSC gamut as much as possible for example. The quantum dots may be perovskite quantum dots.

Alternatively, use is made of phosphors with a fine emission spectrum, or another luminescent material. (Narrow-band) phosphor or another luminescent material suitable for saturation of the red that is desired for the day or NVIS mode is chosen. Alternatively, micro-LEDs which natively emit at the desired wavelengths are chosen.

Figure 1B:
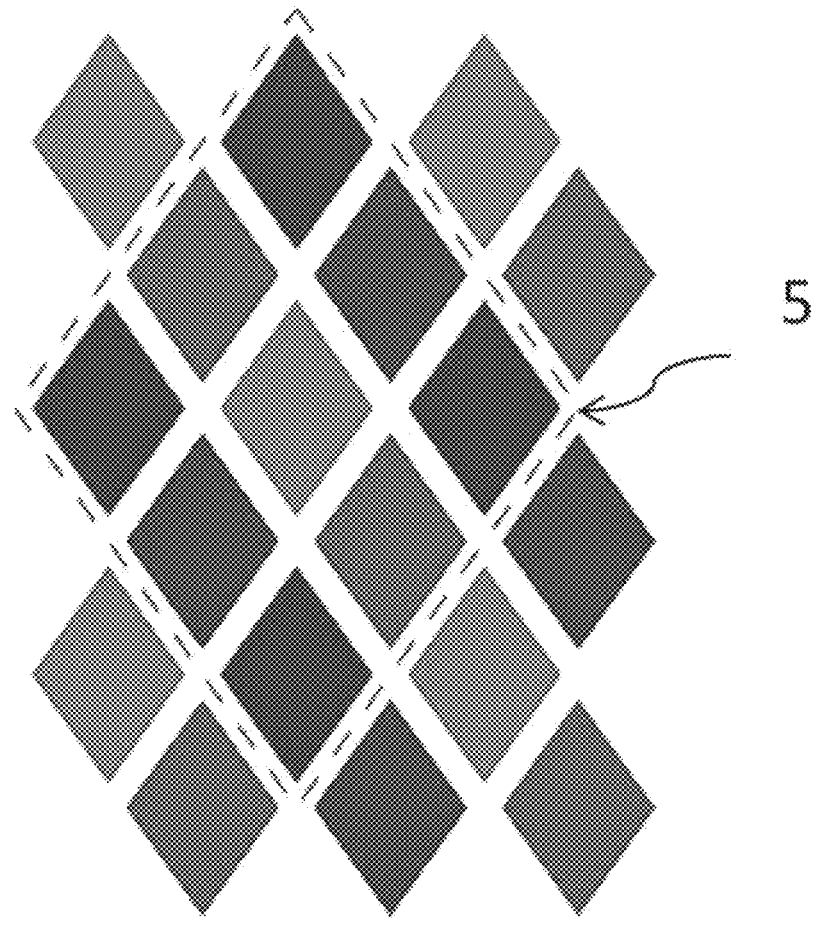

FIG. 1B is a view of an arrangement of micro-LEDs according to a second embodiment of the invention. Here, the light-emitting diodes are in the shape of diamonds.

For the diamond arrangement shown in FIG. 1B, the dashed lines represent the pixel 5, and in this way there are more pixels contributing to the day white.

Depending on the needs of the design, it is possible to choose to favour one colour rather than another in order to adapt to the differences in output from one colour to another.

It is proposed to place proportionally few orange light-emitting diodes, or few blue light-emitting diodes.

Figure 1C:
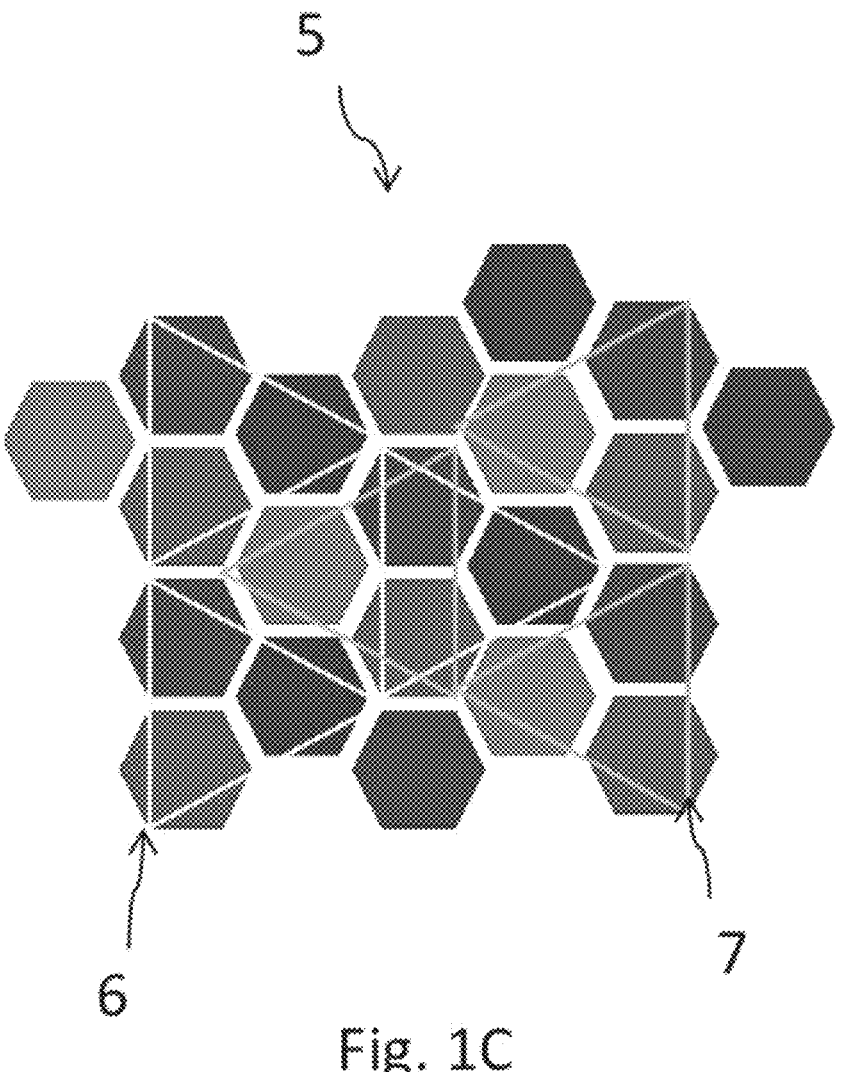

In the embodiment of FIG. 1C, the light-emitting micro-diodes are hexagonal. The structure is symmetrical: for an assembly of two micro-diodes, one green, the other blue, a triangular triplet is formed with an orange micro-diode (for the NVIS mode) or in an opposite direction with a red micro-diode for the day mode.

Figure 1D:
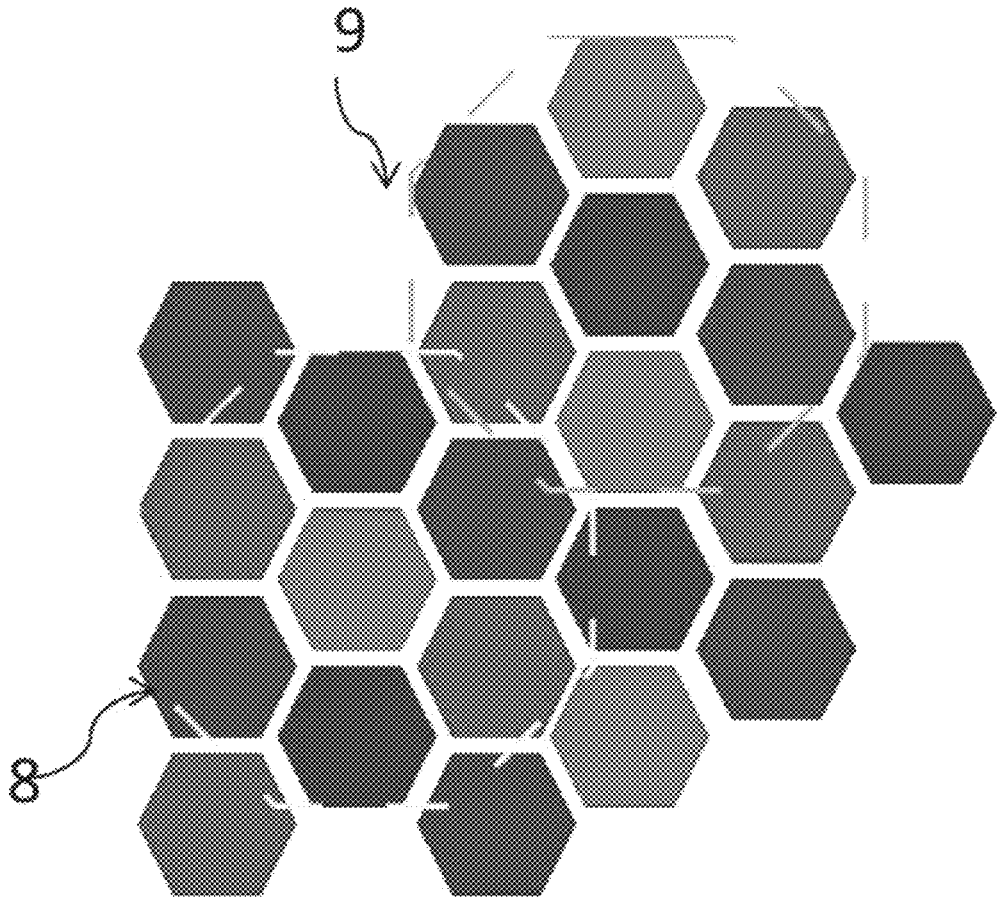

In the embodiment of FIG. 1D, the diodes are hexagonal and the pixel is an octagon. The figure shows an octagonal pixel which contains more red than orange in day mode and an octagonal pixel which contains more orange than red in NVIS mode.

Figure 2:
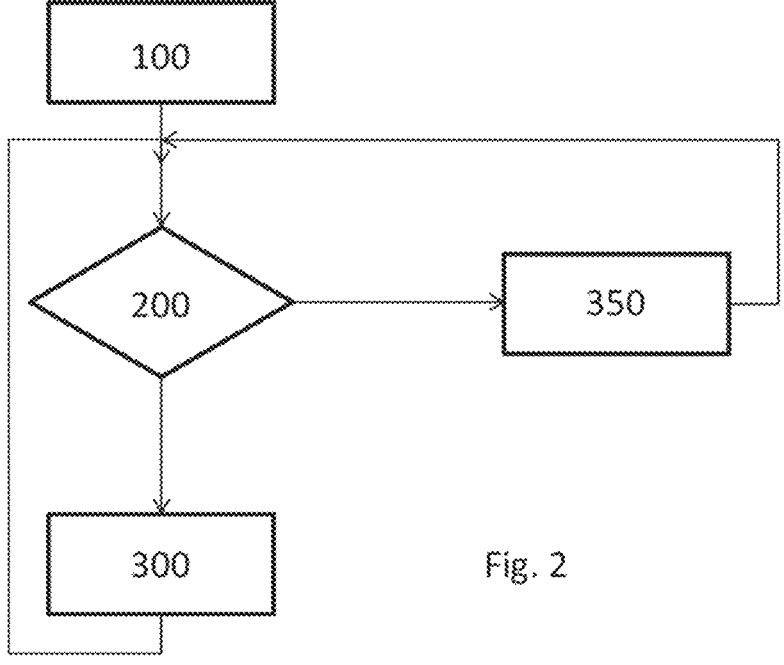
FIG. 2 is a view of a method according to the invention.

FIG. 2 is a scheme of a method for operating a device according to the invention.

A step 100 makes it possible to start the system. A step 200 makes it possible to choose whether the system needs to operate in classic vision mode, with the three micro-LEDs 10, 20 and 30 which make it possible over the course of the operating mode 300, depending on the respective intensities that are imposed on them, to produce a light possibly comprising wavelengths over all the visible light spectrum, from violet to red. Alternatively, if the choosing step 200 makes it possible to decide that the system needs to operate in vision mode for use of the NVIS equipment, it shifts into an operating mode 350 with the three micro-LEDs 10, 20 and 40 which likewise make it possible, depending on the respective intensities that are imposed on them, to produce a light possibly comprising wavelengths over a wide range of the visible light spectrum, completely towards violet but this time, in contrast to the operating mode 300, curtailed at its end towards red, this making it compatible with NVIS vision apparatuses.

Advantageously, it is possible to provide two control circuits or one circuit with drivers that are able to operate in high-current mode or in low-current mode. The low-current mode will be used to control the four LEDs in NVIS mode, and the LED 40 will be controlled solely in low-current mode.

Figure 3:
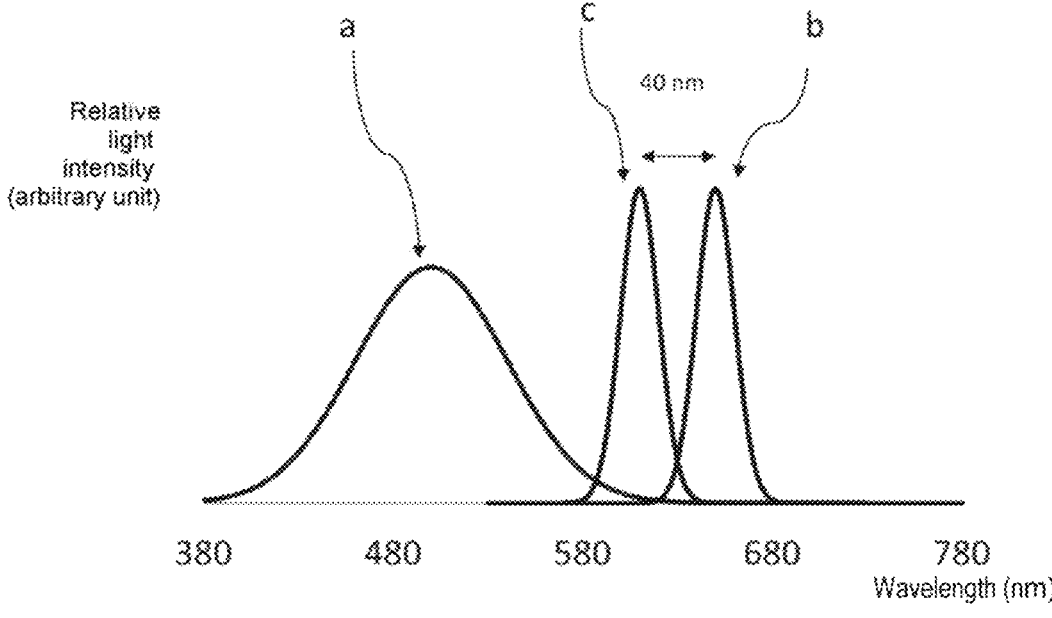
FIG. 3 is a representation of the emission wavelengths of the various elements of an embodiment of the invention.

FIG. 3 shows the emission wavelengths of the various elements of the invention. The visible spectrum, from 380 to 780 nm, is shown on the x-axis and the relative luminous intensity in an arbitrary unit is shown on the y-axis.

Curve a shows the sum of the emissions of the light-emitting diodes, as a variable number depending on the embodiments, which are not the diode closest to the red end of the spectrum. In the most common embodiment, this involves the combination of a blue diode and of a green diode.

The single curve a may therefore be replaced by a combination of several curves, namely the curves of various diodes taken independently of one another, all being diodes which have an emission maximum less close to red than the diode loaded with the rightmost part of the spectrum, which typically is red, and may, according to the invention, be present in two forms, a red and an orange, the first being used in standard conditions, and the second in NVIS compatible use mode.

Curve b shows the emission of the red diode with a fairly fine Gaussian appearance, with a maximum at approx. 650 nm for a maximum intensity a third greater than the maximum intensity of curve a due to the concentration of the energy in a narrow range due to the presence of a single diode. The diode having this curve b as emission curve is used during operation in day mode.

Curve c shows the emission of the orange diode, once again with a fairly fine Gaussian appearance, with a maximum at approx. 610 nm. The diode having this curve c as emission curve is used during operation in NVIS mode, compatible with the use of equipment in night-vision mode.

It is furthermore mentioned here that, for a given diode, the emission spectrum of the diode does not change sufficiently in shape depending on the power provided to the diode such that the change in shape must be taken into account in the description and the definition of the invention. Essentially, it is reasonable to remember that the shape of the emission spectrum of an individual diode is constant from a zero power to the nominal use power of the diode, and that it is perfectly possible to use the given diode whatever the power between the zero power and the expected nominal power, even beyond, without the wavelength of the maximum of the spectrum being significantly modified, or the width of the Gaussian, for example at mid-height, either.

Optionally, the device may offer to the user, control for a gradual transition between the day operating mode, using the red diode and not using the orange diode, to the NVIS operating mode not using the red diode but using the orange diode. The gradual transition may be done by manual control of rotatable button or dial type, and may be used in the circumstances where the NVIS mode is used temporarily, may become temporarily useless, and may become useful again. The control for gradual transition introduces a percentage of power into the red diode and the complementary percentage of power into the orange diode, the percentage being controllable by the rotatable button or dial. Possibly, the gradual control is controlled by a processor and an algorithm, and is implemented automatically, for example based on signals coming from sensors.

The invention claimed is:

1. An electronic display device comprising a display surface, and on the display surface, an arrangement of a plurality of compact assemblies for composing an image, the electronic display device further comprising a circuit for controlling the plurality of compact assemblies and that is configured to control each of the compact assemblies of the plurality individually, each compact assembly being made up of identical inorganic semiconductor microscopic LEDs or micro-LEDs of one single native colour diodes some of which are covered with quantum dots or with phosphor in order to provide colours shifted to the red from the native colour, compact assemblies of the plurality being controlled by said circuit as variable colour pixels of the electronic display device, one group of light-emitting diodes of a compact assembly of the plurality comprising a so-called red diode which is the closest in the group, by its emission spectrum, to the red end of the visible light spectrum and one or more other light-emitting diodes which together have a common emission spectrum comprising, during nominal operation, proportionally less red than that of the red light-emitting diode, said group being controlled to turn on with other compact assemblies of the plurality a colour display pixel for an operator to the naked eye, wherein the compact assembly further comprises an additional light-emitting diode in addition to those of said group, which additional light-emitting diode has, during nominal operation, with respect to said red diode, a wavelength that is shifted less close to red, and with respect to said common emission spectrum a supplementary emission spectrum, said additional light-emitting diode being controlled by the circuit to be turned on as a replacement for said red diode which is then turned off when said group is controlled by the circuit to turn on with the other compact assemblies of the plurality a colour pixel compatible with the use by an operator and in the vicinity of the display device of a night-vision tool sensitive to the near-infrared, said additional light-emitting diode being one of said inorganic semiconductor microscopic LEDs or micro-LEDs of one native colour diodes and being covered with a quantum dot or with a phosphor emitting an orange light, wherein an arrangement of the inorganic semiconductor microscopic LEDs or micro-LEDs of the compact assemblies constitutes a tessellation of the display surface.

2. The electronic display device according to claim 1, wherein the group comprises a red diode, a green diode and a blue diode with proportionally few diodes (40) of a wavelength shifted less close to red.

3. The electronic display device according to claim 1, wherein the wavelength shifted less close to red is shifted 5 to 50 nm with respect to said diode closest to the red end of the visible spectrum.

4. The electronic display device according to claim 1, wherein the wavelength shifted less close to red is less than 640 nm.

5. The electronic display device according to claim 1, wherein the light-emitting diodes are rectangular, hexagonal or in the shape of a diamond.

6. The electronic display device according to claim 1, wherein it comprises a low-current control circuit for the light-emitting diode having a wavelength shifted less close to red, and for the light-emitting diodes used in combination with the light-emitting diode having a wavelength shifted less close to red to form combinations of colours.

7. The electronic display device according to claim 1, wherein the arrangement of the diodes constitutes a tessellation of the surface.

8. The electronic display device according to claim 1, wherein rectangular pixels are arranged in a checkered pattern, widths to widths, lengths to lengths, each of the pixels being composed of four square microscopic LEDs or micro-LEDs of four colours constant from one pixel to the other and arranged in a 2×2 checkered pattern, the four colours being red, green, blue and orange.

9. The electronic display device according to claim 1, wherein the tessellation forms hexagonal pixels.

10. The electronic display device according to claim 1, wherein the tessellation forms diamond pixels.

11. The electronic display device according to claim 1, wherein, the microscopic LEDs or micro-LEDs are in the shape of diamonds.

12. The electronic display device according to claim 1, wherein the microscopic LEDs or micro-LEDs are hexagonal.

* * * * *